United States Patent [19]
Merritt et al.

[11] Patent Number: 5,598,376
[45] Date of Patent: Jan. 28, 1997

[54] DISTRIBUTED WRITE DATA DRIVERS FOR BURST ACCESS MEMORIES

[75] Inventors: Todd A. Merritt; Troy A. Manning, both of Boise, Id.

[73] Assignee: Micron Technology, Inc., Boise, Id.

[21] Appl. No.: 497,354

[22] Filed: Jun. 30, 1995

Related U.S. Application Data

[63] Continuation-in-part of Ser. No. 386,894, Feb. 10, 1995, which is a continuation-in-part of Ser. No. 370,761, Dec. 23, 1994.

[51] Int. Cl.$^6$ ................................................. G11C 11/401
[52] U.S. Cl. ........................... 365/230.06; 365/189.05; 365/204; 365/205; 365/233; 365/233.5
[58] Field of Search ..................... 365/230.01, 189.01, 365/230.06, 189.05, 204, 205, 233.5

[56] References Cited

U.S. PATENT DOCUMENTS

| | | | |
|---|---|---|---|
| 4,344,156 | 8/1982 | Eaton et al. | 365/203 |
| 4,484,308 | 11/1984 | Lewandowski et al. | 364/900 |
| 4,562,555 | 12/1985 | Ouchi et al. | 365/233 |
| 4,567,579 | 1/1986 | Patel et al. | 365/189 |
| 4,575,825 | 3/1986 | Ozaki et al. | 365/189 |
| 4,603,403 | 7/1986 | Toda | 365/189 |
| 4,618,947 | 10/1986 | Tran et al. | 365/230 |
| 4,649,522 | 3/1987 | Kirsch | 365/189 |
| 4,685,089 | 8/1987 | Patel et al. | 365/233 |
| 4,707,811 | 11/1987 | Takemae et al. | 365/239 |
| 4,788,667 | 11/1988 | Nakano | 365/193 |

(List continued on next page.)

OTHER PUBLICATIONS

Samsung Electronics, "Samsung Synchronous DRAM", Mar. 1993, pp. 1–16.
Oki Electric Ind Co., Ltd, "Burst DRAM Function & Pinout", 2nd presentation, Item #619, Sep. 1, 1994.
Toshiba, "Pipelined Burst DRAM", Dec. 1994, JEDEC JC–42.3 Hawaii.
Toshiba America Electronic Components, Inc., "Application Specific DRAM,, 1994", pp. C–178, C–260, C218.
Micron Semiconductor, Inc., "Synchronous DRAM 2 MEG×8 SDRAM", pp. 2–43 through 2–83.
Toshiba America Electronic Components, Inc., "4M DRAM 1991", pp. A–137–A–159.
Micron Semiconductor, Inc., "1994 DRAM Data Book", entire book.
Mosel–Vitelic V53C8257H DRAM Specification Sheet, 20 pgs.

Primary Examiner—Viet Q. Nguyen
Attorney, Agent, or Firm—Schwegman, Lundberg, Woessner & Kluth, P.A.

[57] ABSTRACT

An integrated circuit memory device is designed to perform high speed data write cycles. An address strobe signal is used to latch a first address. During a burst access cycle the address is incremented internal to the device with additional address strobe transitions. A new memory address is only required at the beginning of each burst access. Read/Write commands are issued once per burst access eliminating the need to toggle the Read/Write control line at the device cycle frequency. A transition of the Read/Write control line during a burst access is used to terminate the burst access and initialize the device for another burst access. Write cycle times are maximized to allow for increases in burst mode operating frequencies. Local logic gates near array sense amplifiers are used to control write data drivers to provide for maximum write times without crossing current during input/output line equilibration periods. By gating global write enable signals with global equilibrate signals locally at data sense amp locations, local write cycle control signals are provided which are valid for essentially the entire cycle time minus an I/O line equilibration period in burst access memory devices. For nonburst mode memory devices such as EDO and Fast Page Mode, the write function may begin immediately following the end of the equilibration cycle to provide a maximum write time without interfering with the address setup time of the next access cycle.

19 Claims, 6 Drawing Sheets

U.S. PATENT DOCUMENTS

| | | | |
|---|---|---|---|
| 4,875,192 | 10/1989 | Matsumoto | 365/193 |
| 5,267,200 | 11/1993 | Tobita | 365/189.05 |
| 5,268,865 | 12/1993 | Takasugi | 365/189.05 |
| 5,357,469 | 10/1994 | Sommer et al. | 365/193 |
| 5,392,239 | 2/1995 | Margulis et al. | 365/189 |
| 5,430,680 | 7/1995 | Parris | 365/222 |
| 5,452,259 | 9/1995 | McLaury | 365/230.05 |

DISTRIBUTED WRITE DATA DRIVERS FOR BURST ACCESS MEMORIES

CROSS REFERENCE TO RELATED APPLICATIONS

This application is a continuation in part of application Ser. No. 08/386,894 filed Feb. 10, 1995, which is a continuation in part of application Ser. No. 08/370,761 filed Dec. 23, 1994.

FIELD OF THE INVENTION

This invention relates to memory device architectures designed to provide high density data storage with high speed read and write access cycles. This invention relates more specifically to circuits and methods for controlling memory write cycles.

BACKGROUND OF THE INVENTION

There is a demand for faster, higher density, random access memory integrated circuits which provide a strategy for integration into today's personal computer systems. In an effort to meet this demand, numerous alternatives to the standard DRAM architecture have been proposed. One method of providing a longer period of time when data is valid at the outputs of a DRAM without increasing the fast page mode cycle time is called Extended Data Out (EDO) mode. In an EDO DRAM the data lines are not tri-stated between read cycles in a fast page mode operation. Instead, data is held valid after /CAS goes high until sometime after the next /CAS low pulse occurs, or until /RAS or the output enable (/OE) goes high. Determining when valid data will arrive at the outputs of a fast page mode or EDO DRAM can be a complex function of when the column address inputs are valid, when /CAS fails, the state of /OE and when /CAS rose in the previous cycle. The period during which data is valid with respect to the control line signals (especially /CAS) is determined by the specific implementation of the EDO mode, as adopted by the various DRAM manufacturers.

Methods to shorten memory access cycles tend to require additional circuitry, additional control pins and nonstandard device pinouts. The proposed industry standard synchronous DRAM (SDRAM) for example has an additional pin for receiving a system clock signal. Since the system clock is connected to each device in a memory system, it is highly loaded, and it is always toggling circuitry in every device. SDRAMs also have a clock enable pin, a chip select pin and a data mask pin. Other signals which appear to be similar in name to those found on standard DRAMs have dramatically different functionality on a SDRAM. The addition of several control pins has required a deviation in device pinout from standard DRAMs which further complicates design efforts to utilize these new devices. Significant amounts of additional circuitry are required in the SDRAM devices which in turn result in higher device manufacturing costs.

It is desirable to design and manufacture a memory device having a standard DRAM pinout and a burst mode of operation where multiple data values can be sequentially written to or read from the device in response to a single address location and multiple access strobes. It is also desirable that this new memory device operate at higher frequencies than standard DRAMs.

There is a problem in performing write cycles at high frequencies. In standard Fast Page Mode and EDO mode DRAM devices, write cycles are performed in response to both /CAS and /WE being low after /RAS is low. If an address change occurs at approximately the same time that /CAS falls, then an additional delay is required to equilibrate input/output lines and to fire a new column prior to beginning the write cycle. Data to be written is latched, and the write cycle begins when the latter of /CAS and /WE goes low provided that the equilibrate is complete. Generally, the write time can be considered to be the period of time that /WE and /CAS are simultaneously low. However, in order to allow for maximum page mode operating frequencies, the write cycle is often timed out so that it can continue for a short period of time after /CAS or /WE goes high especially for "late write" cycles. Maintaining the write cycle throughout the time-out period eases the timing specifications for /CAS and /WE that the device user must meet, and reduces susceptibility to glitches on the control lines during a write cycle. The write cycle is terminated after the time out period, and if /WE is high a read access begins based on the address present on the address input lines. The read access will typically begin prior to the next /CAS falling edge so that the column address to data valid specification can be met (tAA). In order to begin the read cycle as soon as possible, it is desirable to minimize the write cycle time while guaranteeing completion of the write cycle. Minimizing the write cycle duration in turn minimizes the margin to some device operating parameters despite the speed at which the device is actually used. Circuits to model the time required to complete the write cycle typically provide an estimate of the time required to write an average memory cell. While it is desirable to minimize the write cycle time, it is also necessary to guarantee that enough time is allowed for the write to complete, so extra delay is added making the write cycle slightly longer than required.

Another aspect of controlling the write cycle timing includes delaying the write enable or write enables to guarantee that the write data drivers are not enabled prior to the completion of the equilibrate function. Equalization of internal data I/O lines is performed in response to column address transitions in preparation for reading or writing data from another memory cell, and also in response to receipt of a write command to reduce the maximum signal transition on the data lines once the write drivers are enabled. If the data lines are each equalized to one half of Vcc for example, then the write data drivers will only need to drive one line from half Vcc to ground, and the other from half Vcc to Vcc. Otherwise, if the write data is not equal to the data previously on the I/O lines, the write data drivers will need to drive both true and compliment I/O lines a full Vcc swing for each data bit being written. Equalization of the data I/O lines reduces the maximum write cycle time by eliminating the worst case signal swing conditions. A simple method of equilibrating the I/O lines is to: disable I/O line drivers; isolate the I/O lines from the digit lines; and couple complimentary I/O lines together. When a true I/O line is coupled to a complimentary I/O line, a logic high will be coupled to a logic low and each line will equalize to a potential approximately half way between a high and a low. It is important to disable the I/O line drivers during equilibration to prevent a true logic driver from being coupled to a complimentary logic driver which will draw excessive current from the logic high source to the logic low source.

Whether /CAS goes low last (early write) or /WE goes low last (late write), the column address will be valid at or before the write command is received. Hence, a delay from receipt of the write command which is greater than the equilibrate time will guarantee that an equilibrate due to a column address change is complete prior to the enabling the write drivers. If an equilibrate of internal data I/O lines is performed in response to receipt of each write command, a simple delay of the write enables will allow for the equilibrate to complete prior to enabling the write drivers. The delay value for the write cycle to write driver enable delay must account for the worst case signal delays from the equilibrate and write driver enable signal sources to the furthest data I/O line equilibrate devices and write data drivers. Since the equilibrate and write driver enable signal sources are located in a main logic area, a considerable signal propagation delay will result from the transmission of these signals across the chip to the furthest I/O line pair. Timing delays due to routing differences in the two signal paths can be very difficult to accurately model and predict. To overcome these difficulties, extra delay is added for timing margin. Unfortunately, this prevents the write drivers from being enabled as soon as the equilibrate function is complete.

Throughout the memory device product lifetime, manufacturing process advances and circuit enhancements often allow for increases in device operating frequencies. The write cycle timing circuits may need to be adjusted to shorten the minimum write cycle times to match these performance improvements. Adjustments may include shortening the equilibrate time, shortening the write cycle to write driver enable time and shortening the write cycle hold time. Fine tuning of these timing circuits is time consuming and costly. If the write cycles are too short, the device may fail under some or all operating conditions. If the write cycles are too long, the device may not be able to achieve the higher operating frequencies that are more profitable for the device manufacturers. Finally, if the equilibrate is not complete prior to enabling the write drivers, then excessive current may flow through the write drivers from Vcc to ground.

With the increased operating frequencies of burst access memory devices a new method of generating the write cycle timing is desired which will allow for maximum write cycle times despite the operating frequency of the device.

SUMMARY OF THE INVENTION

An integrated circuit memory device with a standard DRAM pinout is designed for high speed data access and for compatibility with existing memory systems. A high speed burst mode of operation is provided where multiple sequential accesses occur following a single column address, and read data is output relative to the /CAS control signal. In the burst mode of operation the address is incremented internal to the device eliminating the need for external address lines to switch at high frequencies. Read/Write commands are issued once per burst access eliminating the need to toggle the Read/Write control line at high speeds. Only one control line per memory chip (/CAS) must toggle at the operating frequency in order to clock the internal address counter and the data input/output latches. The load on each /CAS is typically less than the load on the other control signals (/RAS, /WE and /OE) since each /CAS typically controls only a byte width of the data bus.

A new write cycle timing method and circuit allow for maximized write cycle timing at all operating frequencies to provide maximum write cycle timing margins. Write control is maintained throughout a write cycle such that the write operation time approaches the write cycle time. The write function is only halted between write cycles for a period of time required to select a new column of the array and to equilibrate I/O lines in the array. To maximize write cycle times, a logic device is located near the sense amplifiers of the device to control the write function directly with the use of the I/O line equilibrate signal. It is important to disable the write drivers during the equilibrate time to prevent current flow through the true and compliment data drivers while the I/O lines are coupled together. The local write enable circuit allows the write cycle time to be essentially equal to the access cycle time minus the I/O line equilibrate time in burst access memory devices. For nonburst mode memory devices such as EDO and Fast Page Mode, the write function may begin immediately following the end of the equilibration cycle to provide a maximum write time without interfering with the address setup time of the next cycle.

BRIEF DESCRIPTION OF THE DRAWINGS

The features of the invention as well as objects and advantages are best understood by reference to the appended claims, detailed description of particular embodiments and accompanying drawings where:

DETAILED DESCRIPTION OF THE PREFERRED EMBODIMENTS

Figure 1:
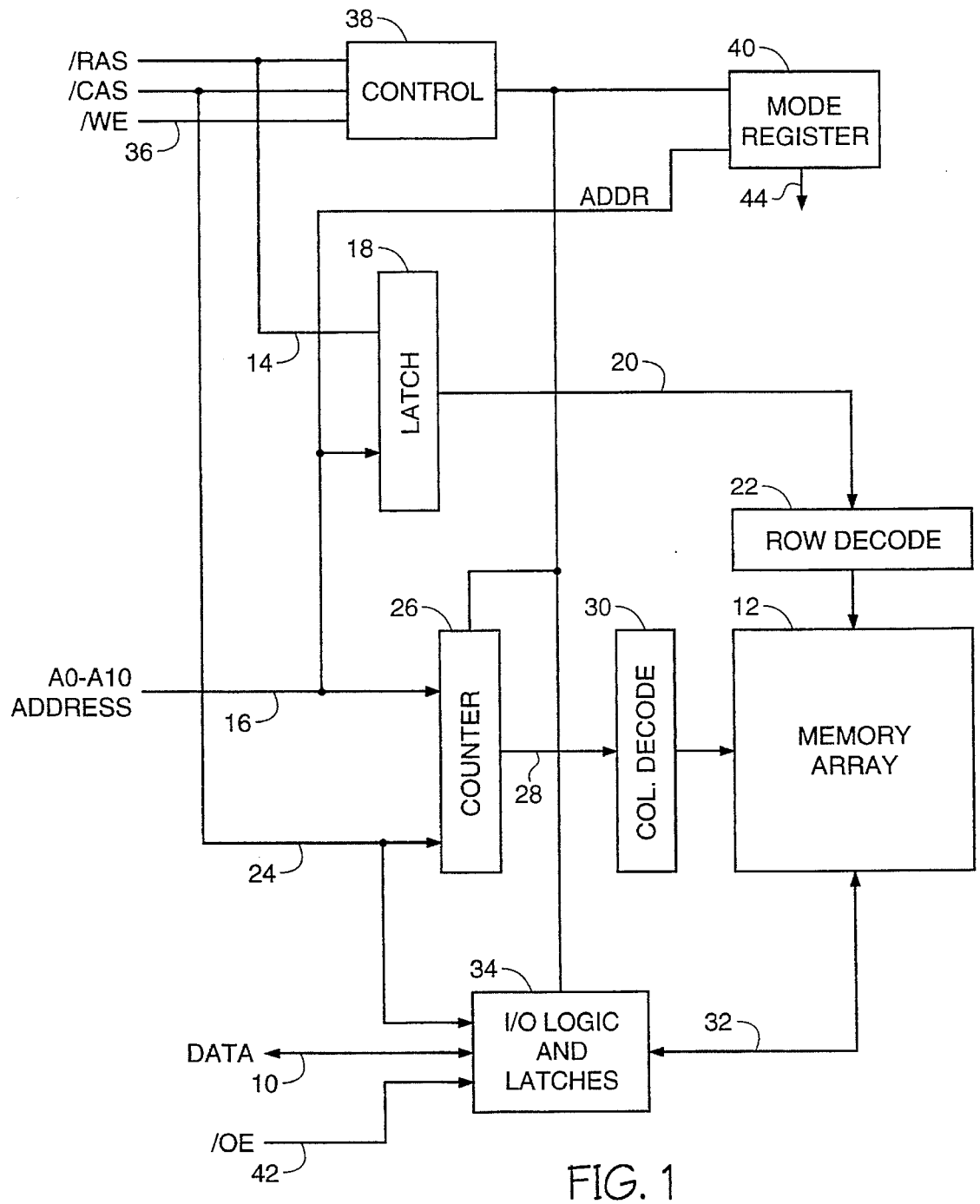
FIG. 1 is an electrical schematic diagram of a memory device in accordance with one embodiment of the invention.

FIG. 1 is a schematic representation of a sixteen megabit device designed in accordance with the present invention. The device is organized as a 2 Meg×8 burst EDO DRAM having an eight bit data input/output path 10 providing data storage for 2,097,152 bytes of information in the memory array 12. The device of FIG. 1 has an industry standard pinout for eight bit wide EDO DRAMs. An active-low row address strobe (/RAS) signal 14 is used to latch a first portion of a multiplexed memory address, from address inputs A0 through A10 16, in latch 18. The latched row address 20 is decoded in row decoder 22. The decoded row address is used to select a row of the memory array 12. A column address strobe (/CAS) signal 24 is used to latch a second portion of a memory address from address inputs 16 into column address counter 26. The latched column address 28 is decoded in column address decoder 30. The decoded column address is used to select a column of the memory array 12.

In a burst read cycle, data within the memory array located at the row and column address selected by the row and column address decoders is read out of the memory array and sent along data path 32 to output latches 34. Data 10 driven from the burst EDO DRAM may be latched external to the device in synchronization with /CAS after a predetermined number of /CAS cycle delays (latency). For a two cycle latency design, the first /CAS falling edge is used to latch the initial address for the burst access. The first burst data from the memory is driven from the memory after the second /CAS falling edge, and remains valid through the third /CAS falling edge. Once the memory device begins to output data in a burst read cycle, the output drivers 34 continue to drive the data lines without tri-stating the data outputs during /CAS high intervals dependent on the state of the output enable and write enable (/OE and /WE) control lines, thus allowing additional time for the system to latch the output data. Once a row and a column address are selected, additional transitions of the /CAS signal are used to advance the column address within the column address counter in a predetermined sequence. The time at which data becomes valid at the outputs of the burst EDO DRAM is dependent only on the timing of the /CAS signal provided that /OE is maintained low, and /WE remains high. The output data signal levels may be driven in accordance with, but are not limited to, CMOS, TTL, LVTTL, GTL, or HSTL output level specifications.

The address may be advanced linearly, or in an interleaved fashion for maximum compatibility with the overall system requirements. The column address may be advanced with each /CAS transition, each pulse, or multiple of /CAS pulses in the event that more than one data word is read from the array with each column address. When the address is advanced with each transition of the /CAS signal, data is also driven from the part after each transition following the device latency which is then referenced to each edge of the /CAS signal. This allows for a burst access cycle where the highest switching control line (/CAS) toggles only once (high to low or low to high) for each memory cycle. This is in contrast to standard DRAMs which require /CAS to go low and then high for each cycle, and synchronous DRAMs which require a full clock cycle (high and low transitions) for each memory cycle. For maximum compatibility with existing EDO DRAM devices, the invention will be further described in reference to a device designed to initiate access cycles on falling edges of the /CAS signal. For designs where falling edges of the /CAS signal initiate an access cycle, the falling edge may be said to be the active transition of the /CAS signal.

It may be desirable to latch and increment the column address after the first /CAS falling edge in order to apply both the latched and incremented addresses to the array at the earliest opportunity in an access cycle. For example, a device may be designed to access two data words per cycle (prefetch architecture). The memory array for a prefetch architecture device may be split into odd and even array halves. The column address least significant bit is used to select between odd and even halves while the other column address bits select a column within each of the array halves. In an interleaved access mode with column address 1, data from columns 0 and 1 are read and the data from column 1 is output followed by the data from column 0 in accordance with standard interleaved addressing as described in SDRAM specifications. In a linear access mode column address 1 is applied to the odd array half, and incremented to address 2 for accessing the even array half to fulfill the two word access. One method of implementing this type of device architecture is to provide a column address incrementing circuit between the column address counter and the even array half. The incrementing circuit increments the column address only if the initial column address in a burst access cycle is odd, and the address mode is linear. Otherwise the incrementing circuit passes the column address unaltered. For a design using a prefetch of two data accesses per cycle, the column address is advanced once for every two active edges of the /CAS signal. In a write cycle, multiple data words may be temporarily stored as they are input to the device. The actual write of data to the memory cells occurs after the last input data is latched, and may extend slightly into the next memory cycle as long as it ends prior to the next column being activated. Prefetch architectures where more than two data words are accessed are also possible.

Other memory architectures applicable to the current invention include a pipelined architecture where memory accesses are performed sequentially, but each access requires more than a single cycle to complete. In a pipelined architecture the overall throughput of the memory approaches one access per cycle, but the data out of the memory is offset by a number of cycles equal to the pipeline length and/or the desired latency from /CAS.

In the burst access memory device, each new column address from the column address counter is decoded and is used to access additional data within the memory array without the requirement of additional column addresses being specified on the address inputs 16. This burst sequence of data continues for each /CAS falling edge until a predetermined number of data accesses equal to the burst length occurs. A /CAS falling edge received after the last burst address has been generated latches another column address from the address inputs 16 and a new burst sequence begins. Read data is latched and output with each falling edge of /CAS after the first /CAS latency.

For a burst write cycle, data 10 is latched in input data latches 34. Data targeted at the first address specified by the row and column addresses is latched with the /CAS signal when the first column address is latched (write cycle data latency is zero). Other write cycle data latency values are possible; however, for today's memory systems, zero is preferred. Additional input data words for storage at incremented column address locations are latched by /CAS on successive /CAS active transitions. Input data from the input latches 34 is passed along data path 32 to the memory array where it is stored at the location selected by the row and column address decoders. As in the burst read cycle previously described, a predetermined number of burst access writes are performed without the requirement of additional column addresses being provided on the address lines 16. After the predetermined number of burst writes occur, a subsequent /CAS pulse latches a new beginning column address, and another burst read or write access begins.

The memory device of FIG. 1 may include the option of switching between burst EDO and standard EDO modes of operation. In this case, the write enable signal /WE 36 is used at the row address latch time (/RAS falling, /CAS high) to determine whether memory accesses for that row are burst or page mode cycles. If /WE is low when /RAS falls, burst access cycles are selected. If /WE is high at /RAS falling, standard extended data out (EDO) page mode cycles are selected. Both the burst and EDO page mode cycles allow for increased memory device operating frequencies by not requiring the data output drivers 34 to place the data lines 10 in a high impedance state between data read cycles while /RAS is low. DRAM control circuitry 38, in addition to performing standard DRAM control functions, controls the I/O circuitry 34 and the column address counter/latch 26 in accordance with the mode selected by /WE when /RAS falls. In a burst mode only DRAM, or in a device designed with an alternate method of switching between burst and non-burst access cycles, the state of /WE when /RAS falls may be used to switch between other possible modes of operation such as interleaved versus linear addressing modes.

The write enable signal is used in burst access cycles to select read or write burst accesses when the initial column address for a burst cycle is latched by /CAS. /WE low at the column address latch time selects a burst write access. /WE high at the column address latch time selects a burst read access. The level of the /WE signal must remain high for read and low for write burst accesses throughout the burst access. A low to high transition within a burst write access terminates the burst access, preventing further writes from occurring. A high to low transition on /WE within a burst read access likewise terminates the burst read access and places the data output 10 in a high impedance state. Transitions of the /WE signal may be locked out during critical timing periods within an access cycle in order to reduce the possibility of triggering a false write cycle, and/or to guarantee the completion of a write cycle once it has begun. After the critical timing period the state of /WE determines whether a burst access continues, is initiated, or is terminated. Termination of a burst access places the DRAM in a state to receive another burst access command. Both /RAS and /CAS going high during a burst access also terminates the burst access cycle placing the data drivers in a high impedance output state. Read data may remain valid at the device outputs if /RAS alone goes high while /CAS is active for compatibility with hidden refresh cycles, otherwise /RAS high alone may be used to terminate a burst access. A minimum write enable pulse width is only required when it is desired to terminate a burst read and then begin another burst read, or terminate a burst write prior to performing another burst write with a minimum delay between burst accesses. In the case of burst reads, /WE transitions from high to low to terminate a first burst read, and then /WE transitions back high prior to the next falling edge of /CAS in order to specify a new burst read cycle. For burst writes, /WE transitions high to terminate a current burst write access, then back low prior to the next falling edge of /CAS to initiate another burst write access. A minimum /WE pulse width may be specified to guarantee recognition of the /WE pulse despite /WE lockout periods. If no /WE lockout circuit is used, termination of a burst access may be edge sensitive to the /WE signal.

A basic implementation of the device of FIG. 1 may include a fixed burst length of 4, a fixed /CAS latency of 2 and a fixed interleaved sequence of burst addresses. This basic implementation requires very little additional circuitry to the standard EDO page mode DRAM, and may be mass produced to provide the functions of both the standard EDO page mode and burst EDO DRAMs. This device also allows for the output enable pin (/OE) to be grounded for compatibility with many SIMM module designs. When not disabled (tied to ground), /OE is an asynchronous control which prevents data from being driven from the part in a read cycle if it is inactive (high) prior to /CAS falling and remains inactive beyond /CAS rising. If these setup and hold conditions are not met, then the read data may be driven for a portion of the read cycle. It is possible to synchronize the /OE signal with /CAS, however this typically increases the /CAS to data valid delay time and doesn't allow for the last output data to be disabled prior to /RAS high without an additional /CAS low pulse which would otherwise be unnecessary. In a preferred embodiment, if /OE transitions high at any time during a read cycle the outputs remain in a high impedance state until the next falling edge of /CAS despite further transitions of the /OE signal.

Programmability of the burst length, /CAS latency and address sequences may be accomplished through the use of a mode register 40 which latches the state of one or more of the address input signals 16 or data signals 10 upon receipt of a write-/CAS-before-/RAS (WCBR) programming cycle. In such a device, outputs 44 from the mode register control the required circuits on the DRAM. Burst length options of 2, 4, 8 and full page as well as /CAS latencies of 1, 2 and 3 may be provided. Other burst length and latency options may be provided as the operating speeds of the device increase, and computer architectures evolve. The device of FIG. 1 includes programmability of the address sequence by latching the state of the least significant address bit during a WCBR cycle. The burst length and /CAS latency for this particular embodiment are fixed. Other possible alterations in the feature sets of this DRAM include having a fixed burst mode only, selecting between standard fast page mode (non-EDO) and burst mode, and using the output enable pin (/OE) 42 in combination with /RAS to select between modes of operation. Also, a WCBR refresh cycle could be used to select the mode of operation rather than a control signal in combination with /RAS. A more complex memory device may provide additional modes of operation such as switching between fast page mode, EDO page mode, static column mode and burst operation through the use of various combinations of /WE and /OE at /RAS falling time. One mode from a similar set of modes may be selected through the use of a WCBR cycle using multiple address or data lines to encode the desired mode. Alternately, a device with multiple modes of operation may have wire bond locations, or programmable fuses which may be used to program the mode of operation of the device.

A preferred embodiment of a sixteen bit wide burst EDO mode DRAM designed in accordance with the teachings of this invention has two column address strobe input pins /CASH and /CASL. For read cycles only one /CAS signal needs to toggle. The second /CAS may remain high or toggle with the other /CAS. During burst read cycles, all sixteen data bits will be driven out of part during a read cycle even if one /CAS remains inactive. In a typical system application, a microprocessor reads all data bits on a data bus in each read cycle, but may only write certain bytes of data in a write cycle. Allowing one of the /CAS control signals to remain static during read cycles helps to reduce overall power consumption and noise within the system. For burst write access cycles, each of the /CAS signals (CASH and /CASL) acts as a write enable for an eight bit width of the data. The two /CAS's are combined in an AND function to provide a single internal /CAS which will go low when the first external /CAS falls, and returns high after the last external /CAS goes high. All sixteen data inputs are latched when the first of the /CAS signals transitions low. If only one /CAS signal transitions low, then the eight bits of data associated with the /CAS that remained high are not stored in the memory.

The present invention has been described with reference to several preferred embodiments. Just as fast page mode DRAMs and EDO DRAMs are available in numerous configurations including x1, x4, x8 and x16 data widths, and 1 Megabit, 4 Megabit, 16 Megabit and 64 Megabit densities; the memory device of the present invention may take the form of many different memory organizations. It is believed that one who is skilled in the art of integrated circuit memory design can, with the aide of this specification design a variety of memory devices which do not depart from the spirit of this invention. It is therefore believed that detailed descriptions of the various memory device organizations applicable to this invention are not necessary.

It should be noted that the pinout for this new burst EDO memory device may be identical to the pinout for a standard EDO DRAM. The common pinout allows this new device to be used in existing memory designs with minimum design changes. The common pinout also allows for ease of new designs by those of skill in the art who are familiar with the standard EDO DRAM pinout. Variations of the described invention which maintain the standard EDO DRAM pinout include driving the /CAS pin with a system clock signal to synchronize data access of the memory device with the system clock. For this embodiment, it may be desirable to use the first /CAS active edge after /RAS falls to latch the row address, a later edge may be used to latch the first column address of a burst access cycle. After row and column addresses are latched within the device, the address may be incremented internally to provide burst access cycles in synchronization with the system clock. Other pin function alternatives include driving the burst address incrementing signal on the /OE pin since the part does not require a data output disable function on this pin. Other alternate uses of the /OE pin also allow the device to maintain the standard EDO pinout, but provide increased functionality such as burst mode access. The /OE pin may be used to signal the presence of a valid column starting address, or to terminate a burst access. Each of these embodiments provides for a high speed burst access memory device which may be used in current memory systems with a minimum amount of redesign.

Figure 2:
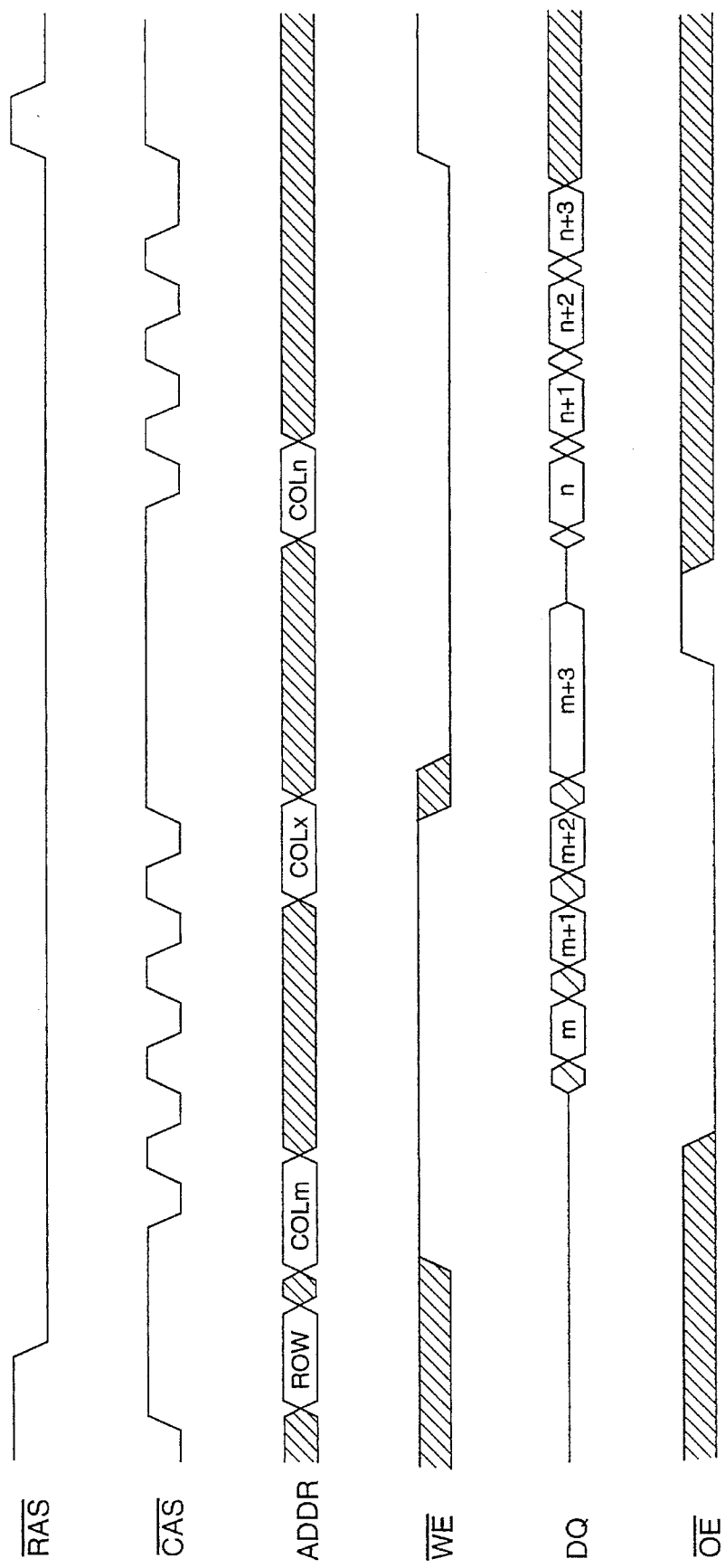
FIG. 2 is a timing diagram for a method of accessing the device of FIG. 1.

FIG. 2 is a timing diagram for performing a burst read followed by a burst write of the device of FIG. 1. In FIG. 2, a row address is latched by the /RAS signal. /WE is low when /RAS falls for an embodiment of the design where the state of the /WE pin is used to specify a burst access cycle at /RAS time, otherwise /WE may be a "don't care" at /RAS falls. Next, /CAS is driven low with /WE high to initiate a burst read access, and the initial column address is latched. The data out signals (DQ's) are not driven in the first /CAS cycle. On the second falling edge of the /CAS signal the internal address generation circuitry provides a column address, and another access of the array begins. The first data out is driven from the device following the second /CAS and a /CAS to data access time (tCAC) delay. Additional burst access cycles continue, for a device with a specified burst length of four, until the fifth falling edge of /CAS which latches a new column address for a new burst read access. /WE falling in the fifth /CAS cycle terminates the burst access, and initializes the device for additional burst accesses. The sixth falling edge of /CAS with /WE low is used to latch a new burst address, latch input data and begin a burst write access of the device. Additional data values are latched on successive /CAS falling edges until /RAS rises to terminate the burst access.

It should be noted from FIG. 2 that for burst read cycles the data remains valid on the device outputs as long as the /OE pin is low, except for brief periods of data transition. Also, since the /WE pin is low prior to or when /CAS falls, the data input/output lines are not driven from the part during write cycles, and the /OE pin is a "don't care". Only the /CAS signal and the data signals toggle at relatively high frequency, and no control signals other than /CAS are required to be in an active or inactive state for one /CAS cycle time or less. This is in contrast to SDRAMs which often require row address strobes, column address strobes, data mask, and read/write control signals to be valid for one clock cycle or less for various device functions. Typical DRAMs also allow for the column address to propagate through to the array to begin a data access prior to /CAS falling. This is done to provide fast data access from /CAS falling if the address has been valid for a sufficient period of time prior to /CAS falling for the data to have been accessed from the array. In these designs an address transition detection circuit is used to restart the memory access if the column address changes prior to /CAS falling. This method actually requires additional time for performing a memory access since it must allow for a period of time at the beginning of each memory cycle after the last address transition to prepare for a new column address by equilibrating internal I/O lines, deselecting all columns and selecting a new column. Changes in the column address just prior to /CAS falling may increase the access time by approximately five nanoseconds. An embodiment of the present invention will not allow the column address to propagate through to the array until after /CAS has fallen. This eliminates the need for address transition detection circuitry, and allows for a fixed array access time relative to /CAS. In a preferred embodiment of the design, the address counter is advanced on /CAS rising edges, and the address generated in the counter is then presented to the array on the next /CAS falling edge in a burst access.

Figure 3:
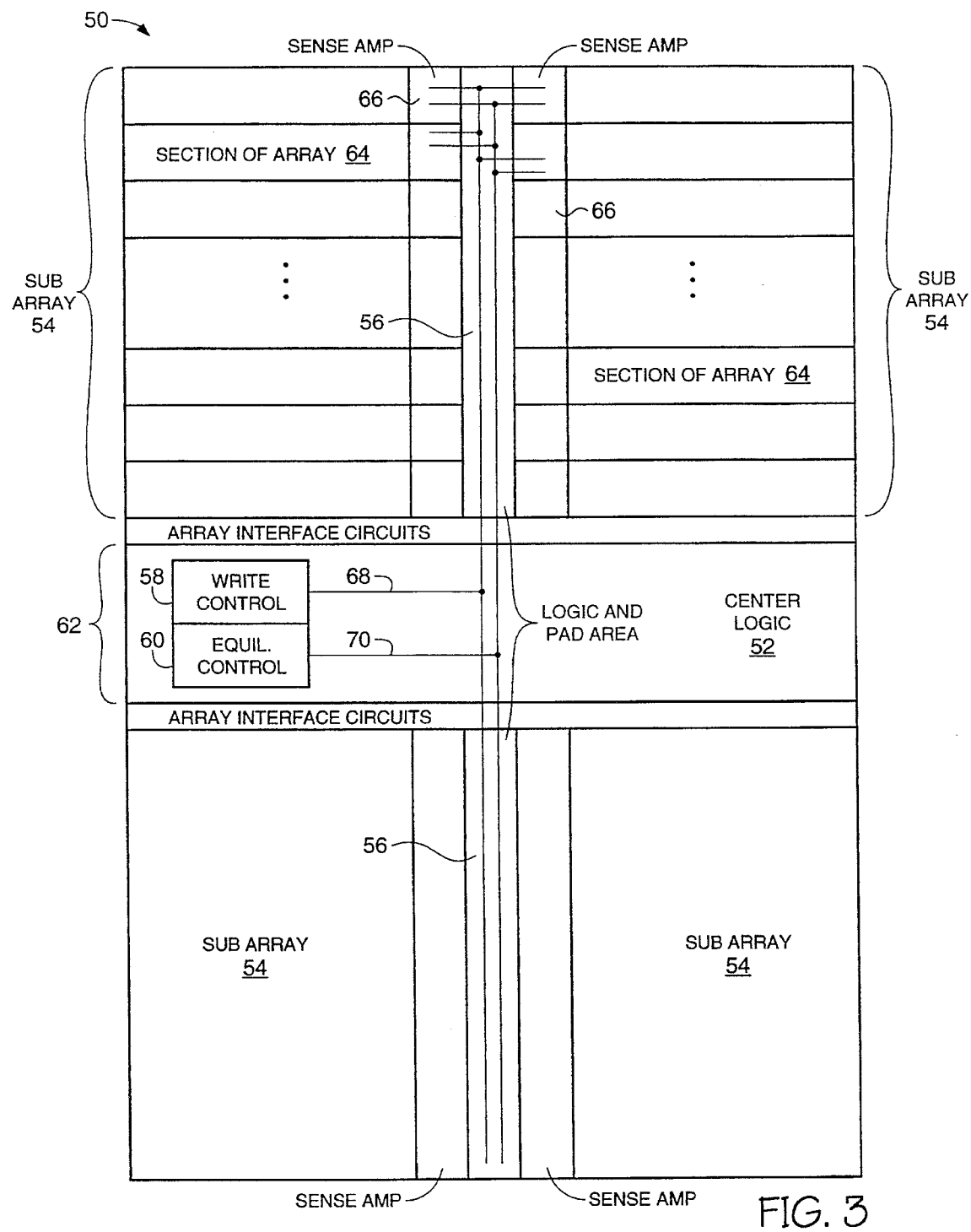
FIG. 3 is a top view of a general device layout for a device designed in accordance with the teachings of the present invention.

FIG. 3 shows a topographic layout view of one embodiment of a memory device designed in accordance with the teachings of the present invention. Memory device 50 has a central logic region 52, array regions 54, and logic and pads regions 56. Circuitry in region 52 includes write control circuitry 58 and equilibration control circuitry 60 in addition to other memory timing control circuits. Circuitry in array interface regions 62 includes array address drivers. Circuitry in the logic and pads areas includes data buffers and I/O pads. I/O pads running through the center of a chip in this fashion is indicative of a Leads Over Chip (LOC) packaging configuration. The layout shown is for example only. Other possible layouts include but are not limited to: a) layouts with pads and central logic circuits located on the sides and/or ends of the memory device with array circuitry occupying the center of the device; b) central logic circuits located centrally along one axis of the device with pads on the sides or ends of the device; or c) central logic in the center of the chip with pads running through the chip and on the sides or ends of the chip for a hybrid of LOC and conventional bonding.

Array regions 54 are broken into 16 subarray regions 64 each of which has an associated data sense amplifier 66 located along one edge of the array. Write enable signal 68 and I/O line equilibrate signal 70 are routed to each data sense amplifier.

Figure 4:
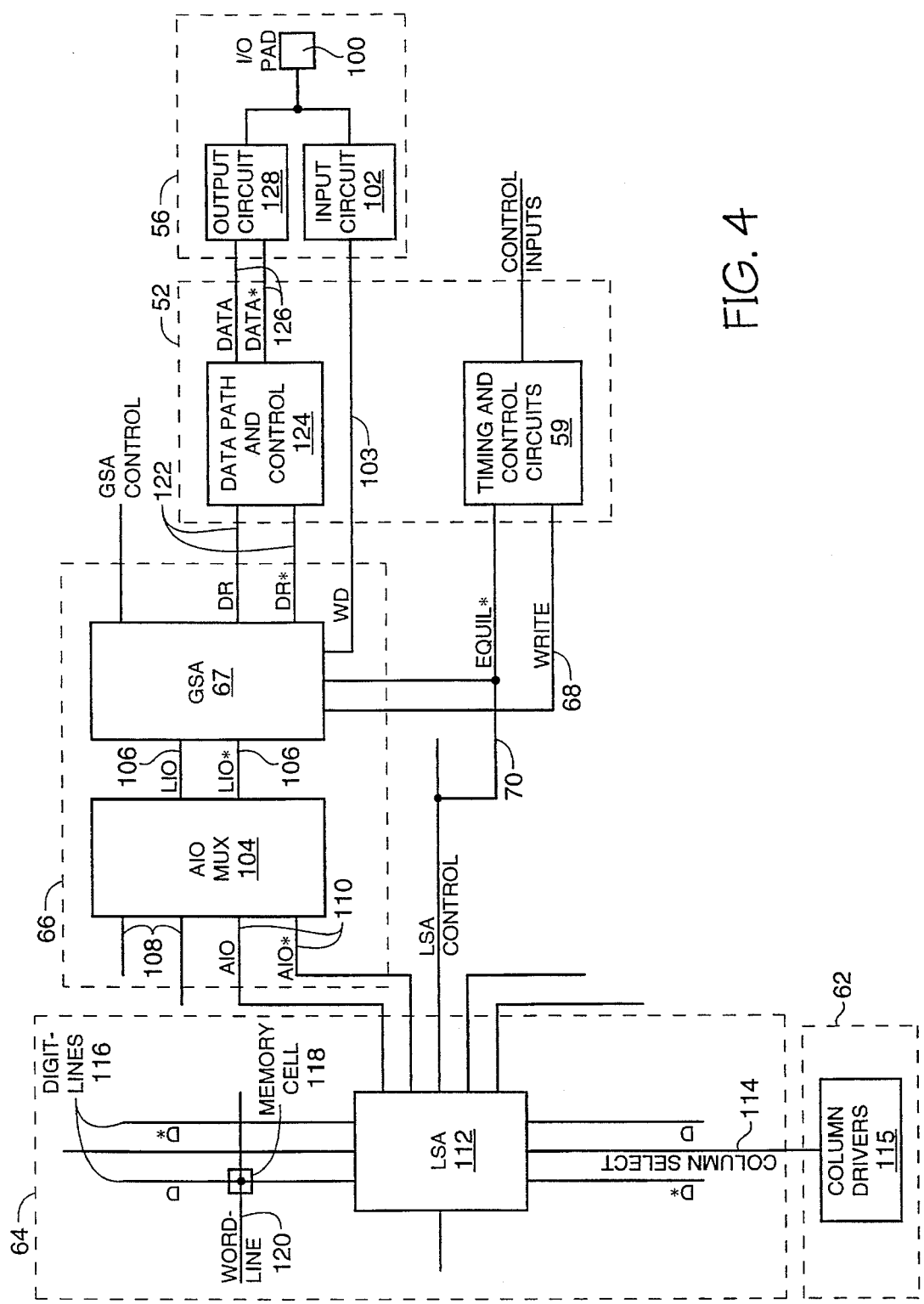
FIG. 4 is block level schematic of a data path portion of the device of FIG. 3.

FIG. 4 is block level schematic of a data path portion of the device of FIG. 3. Elements in FIG. 4 that have the same or similar function as numbered elements in FIG. 3 are given the same reference numerals. In FIG. 4, data written to the memory device is received on data I/O pad 100. The write data is passed through input circuit 102 to a global sense amp 66 over write data lines 103. For this example, the sense amplifier includes an I/O line multiplexer 104 which is used to select a path from local I/O data line pair 106 to one of two pairs of array I/O lines 108 and 110. Write data is driven from write data lines 103 to I/O lines 106 when enabled by a logical combination of the equilibrate signal 70 and the write enable signal 68 from timing circuit 59 and data path control circuit 124 of central logic circuitry 52. In this example array I/O lines 108 are coupled to an adjacent section of the array (not shown). Array I/O lines 110 are true and compliment lines coupled to a local array sense amplifier 112 which is part of array section 64. Column select signal 114 from column driver 115 couples array data I/O lines 110 to a pair of complimentary digit lines 116 inside the local sense amplifier 112. One of the complimentary digit lines is coupled to a memory cell 118 through an access device which is selected by a signal on word line 120 from a row address decoder.

Read data follows the same path from the memory cell to the global sense amp where it is then driven on complimentary data read lines 122 to complimentary data lines 126 under control of data path control logic 124 and timing circuits 59. Complimentary data 126 is driven to an I/O pad 100 through output circuit 128.

This specific embodiment is not intended to provide an exhaustive description of all forms of the present invention. For example, I/O line multiplexer 104 would not be necessary if there is a global sense amp 67 for each pair of array I/O lines. Alternatively, additional array I/O lines could be multiplexed through the multiplexer 104 to allow for even fewer global sense amplifiers. Another variation is to allow read and write data to share a common path between the global sense amplifiers and the I/O pad. Also, separate input and output data pins can be provided. Numerous additional variations are possible and will be recognized by one of skill in the art.

Figure 5:
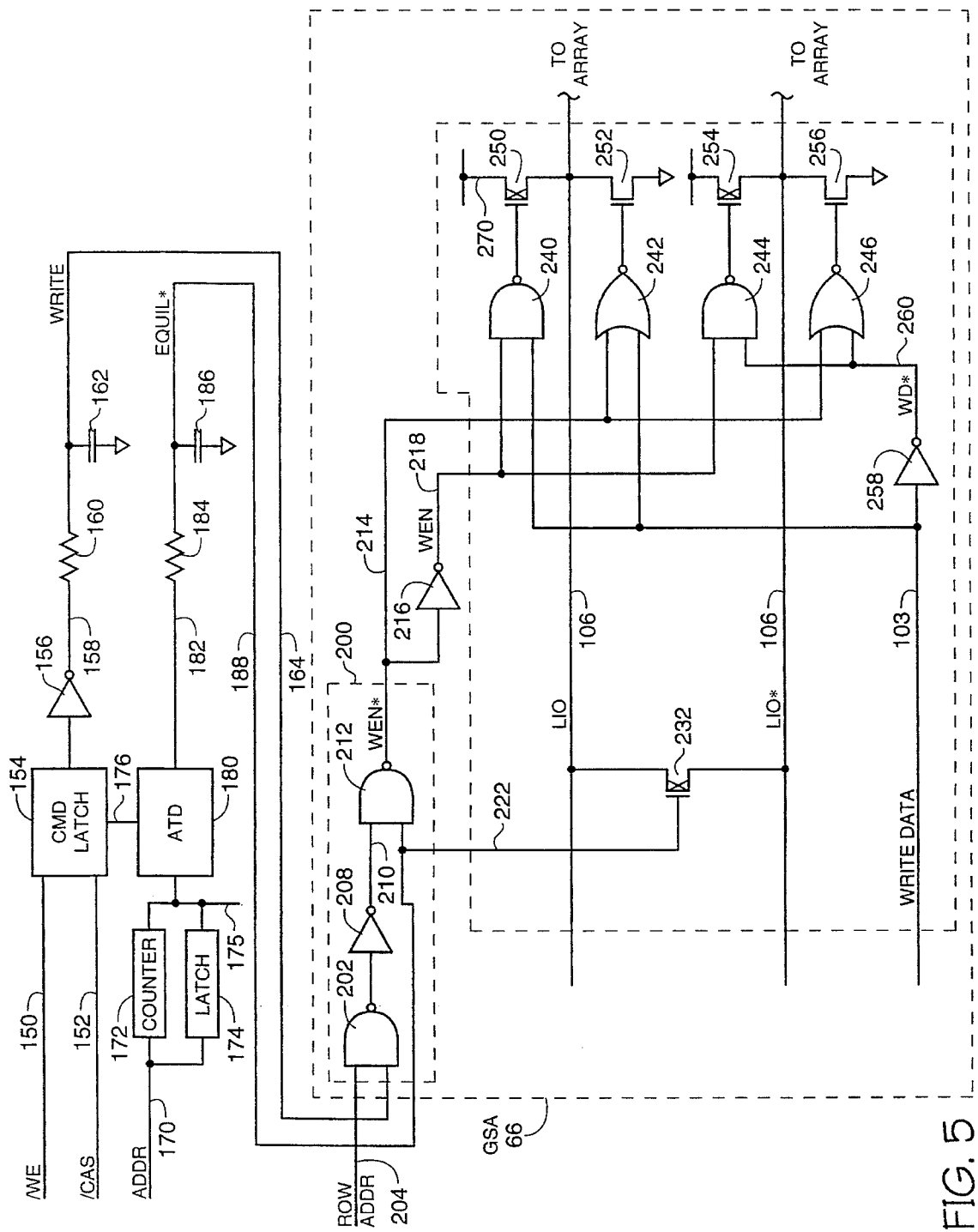
FIG. 5 is a more detailed schematic of a portion of the circuitry of FIG. 4.

FIG. 5 is a schematic diagram providing additional detail for portions of the circuitry of FIG. 4. In FIG. 5, /WE and /CAS are logically combined in command latch and control circuit 154. The write command output of circuit 154 is buffered through driver 156 to write command signal line 158. The write command is coupled to a plurality of sense amps 66 through a distributed line resistance represented by resistor 160 over a signal line with distributed capacitive load represented by capacitor 162. Write signal 164 arriving at the sense amplifier will be a delayed version of the output of the write command from the command latch.

Address inputs 170 are coupled to an address counter 172 and/or column address latch 174 which provide a burst column address 175 to the memory array. The column address and a version of the write command 176 are used to generate an equilibrate signal 182 in the address transition detection circuit 180. For burst accesses, the address transition circuit may generate the equilibrate signal synchronously with an access cycle strobe signal rather than waiting for an actual address transition to be detected, especially if the address is advanced on rising /CAS edges in preparation for the next active falling edge. Equilibration control signal 182 passes through distributed resistance 184, and is loaded by distributed capacitance 186. A delayed version of the equilibrate signal 188 is coupled to the sense amp 66.

The time delay of the write and equilibrate signals 164 and 188 at sense amp 66 will be dependent on which sense amp is being driven, as the distributed resistance and capacitances will vary for each sense amp location. Write command 164 and equilibrate signal 188 are combined at the global sense amp 66 in circuit 200. In circuit 200, the write command is gated with a decoded row address signal 204 in circuits 202 and 208. Gated write command 210 is then combined with the equilibrate signal in logic gate 212 to form a write driver enable signal 214. Equilibrate signal 188 provides an active low enable signal to data I/O line equilibration device 232. When the equilibrate signal on line 188 is low, device 232 couples the two data I/O lines 106 together to equalize their potentials. A low on line 188 also disables logic device 212 preventing the write driver enable 214 from going active. When the equilibrate control signal 188 transitions high, the equilibration device 232 is deactivated, and the write driver enable gate 212 is enabled. For write cycles it is beneficial to provide the write command on line 164 before the equilibrate signal 188 goes high, then as soon as the equilibrate signal 188 goes high, the write command will be passed through gate 212 placing the write enable signal 214 in an active low condition without the requirement for an equilibration to write enable delay. Signal 214 is inverted in inverter 216 to provide an active high write enable 218. The active low write enable goes to two NOR gates 242 and 246. Active high write enable 218 is coupled to NAND gates 240 and 244. The NOR and NAND gates pass write data to the I/O lines through devices 250–256 when enabled by the write driver enable signals 214 and 218. For writing a logic "one" for example, the write data on line 103 may be high. A high on signal 103 in combination with a high write driver enable on signal line 218 will provide a low output from NAND gate 240 which will turn on device 250 to drive a logic one on the true I/O line. The high signal on data line 103 will disable NOR gate 242 to eliminate a current path to ground while NAND 250 is turned on. Data line 103 is inverted at inverter 258 to provide compliment data 260. When data line 103 is high, complimentary data line 260 will be low which will enable NOR gate 246 and disable NAND gate 244. Enabled NOR gate 246 combined with the active write driver enable signal 214 will provide a high output from NOR 246 to turn on device 256 and drive the complimentary I/O line low. For a maximized data write cycle time, the write command 164 can remain active throughout a burst write access. In this case, the write drivers are enabled and disabled by the equilibrate signal which will occur at the beginning of each access cycle. Multiple write command signals 158 may be utilized in devices with multiple /CAS or multiple /WE inputs to control writes to one of multiple data bytes for example. The decoded row address input prevents the write drivers from driving data on I/O lines in nonselected sections of the array. Multiplexer 104 of FIG. 4 may be turned on during equilibrate and write portions of the cycle to allow array I/O lines to first be equilibrated and then receive write data. For nonburst mode memory devices, it is beneficial to provide the write command prior to the end of the equilibrate function to allow the write to begin as soon as possible. For these devices, the write will typically end prior to the next /CAS falling edge to allow the device to meet the column address to data valid access time in (TAA). For EDO devices in particular, the page mode cycle time is very short, but the address access time begins while /CAS is high, so the write cycles should end as soon as possible. One way to allow the write cycle to end as soon as possible is to begin it immediately after the equilibrate is complete.

It is important to note that devices 250 and 256 will generally be enabled simultaneously, as will devices 252 and 254. If the enable gate 212 were not locally present, then the write enable signal would need to be delayed from the equilibrate disable time to guarantee that a current path through devices 250, 232 and 256 or devices 252, 232 and 254 does not exist.

At the end of a burst write access, the write enable may be deactivated in response to /RAS high and /CAS high, /RAS high alone, or after a time-out period following /CAS high. As stated above, the write command may be held active throughout a burst write access. Alternatively, it may be cleared at the beginning of each access cycle, and then relatched provided that /WE is low on the following /CAS high to low transition. If cleared, the period of time that the write command is inactivated within a burst write access is preferably shorter than the equilibrate time so that the write cycle can be maximized which in turn allows for a minimum cycle time. When a read command is detected (/WE high at /CAS falling), a current burst write access will be terminated and a burst read access will begin. It may be desirable to gate the equilibrate signal with the read command and the write control signal to ensure that the equilibrate signal does not end prior to the write control signal becoming invalid. This would be done to prevent the write drivers from becoming enabled for a fraction of the first read cycle in a burst read access sequence.

By gating the write command and equilibrate signals at the sense amplifiers, numerous advantages are obtained over the simple write command delay. One advantage is a maximized write time since the write cycle can begin as soon as the equilibrate is complete for all device types, and can last until the next cycle begins in burst access devices. A second advantage is elimination of write driver enable delay circuitry which can have a variable delay dependent on the operating conditions of the memory device (supply voltage, temperature, etc.). Each driver will be fired when the equilibrate signal is locally deactivated, eliminating the possibility of crossing current through complimentary write drivers while complimentary data lines are coupled together for equilibration.

A memory device may be designed with multiple /CAS inputs as described above. For a memory device with two /CAS inputs where each /CAS controls eight bits of a sixteen bit wide data port, a write cycle where only one /CAS is low must not write all data bits from the data input to the memory. A portion of the write data path associated with an inactive /CAS may be interrupted in a number of ways. Each of the two /CAS signals may enable half of the column address decoders such that no column will be selected in half of the memory associated with a high /CAS in a write cycle. In this case the write data drivers can be enabled, but the data I/O lines associated with a disabled column decoder will not be coupled to any memory cells. Alternately, the write control signals may be gated with the appropriate /CAS signal to prevent some of the write data drivers from being enabled. In this case, read data may be coupled from some memory cells to data I/O lines.

Figure 6:
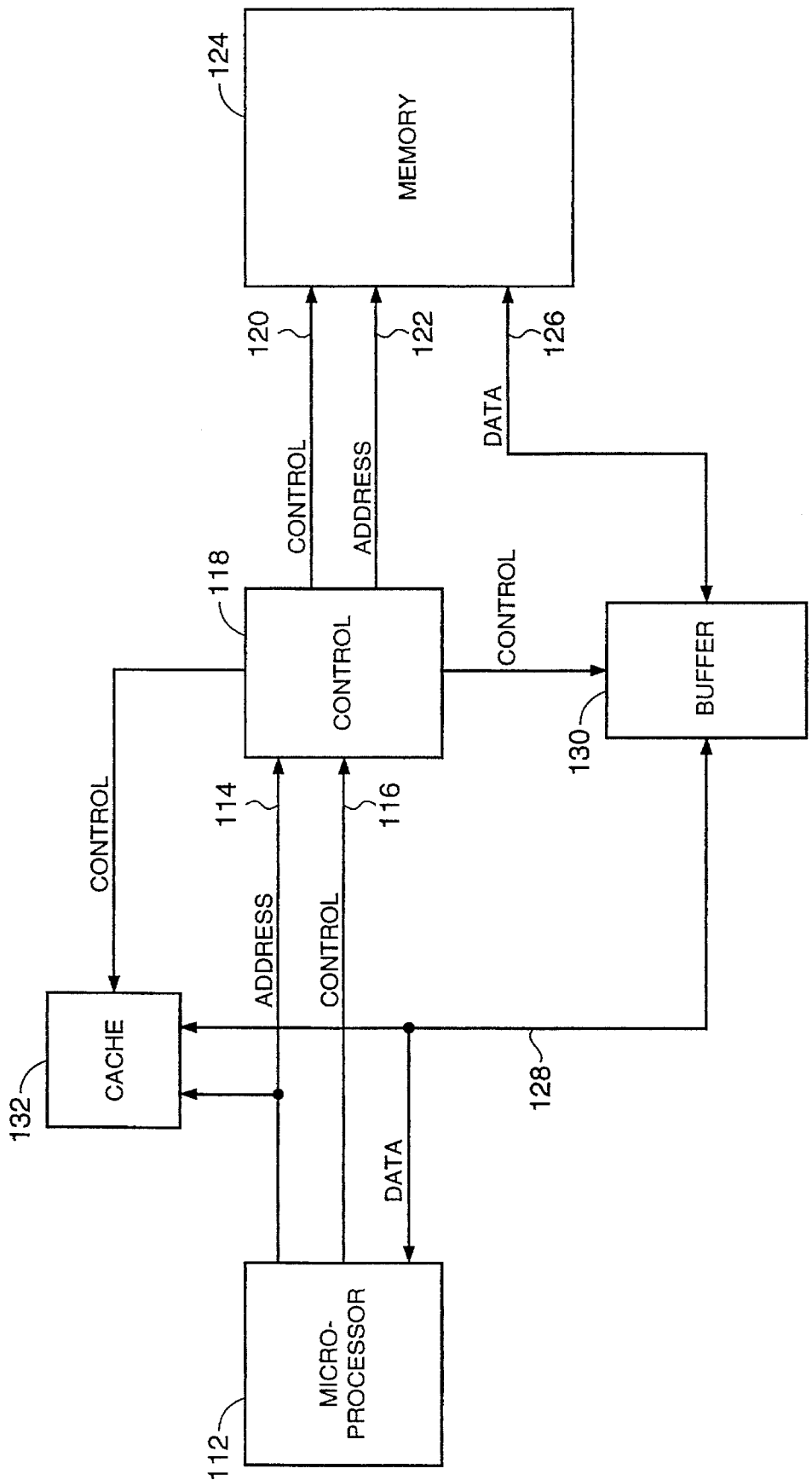
FIG. 6 is a schematic diagram of a computer system designed in accordance with the teachings of the present invention.

FIG. 6 is a schematic representation of a data processing apparatus designed in accordance with the present invention. For the purposes of this specification a microprocessor may be, but is not limited to, a central processing unit (CPU), a microprocessor, a microcontroller, a digital signal processor, or an arithmetic processor. In FIG. 6, microprocessor 112 is connected via address lines 114 and control lines 116 to a memory control circuit 118. The memory control circuit provides address and control signals on lines 122 and 120 respectively to a burst access memory device 124. The burst access memory device sends and receives data over data bus 126. Optional data bus buffer 130 between memory data bus 126 and microprocessor data bus 128 allows for amplification of the data signals, and/or synchronization with the microprocessor and memory control signals. A fast static random access memory (SRAM) cache circuit 132 is also optional and provides higher speed access to data stored in the cache from the memory circuit or the microprocessor. Memory control circuit 118 may be incorporated within the microprocessor. The memory control circuit provides the required address strobe signals and read/write control signals required for burst mode access of the memory circuit. By providing burst access of the memory by the processor, a computer with relatively high memory bandwidth can be designed without the requirement of a fast SRAM cache. SPAMs which are fast enough to provide memory access without wait states can significantly add to the cost of a computer. Thus the burst access memory device of the present invention allows for medium to high performance computers to be manufactured at a cost which is significantly less than those manufactured today. Use of the burst access memory device of the present invention in cooperation with a fast SRAM cache allows for an even higher performance computer design by providing fast access to main memory in the event of a cache miss.

In a burst write operation, the processor 112 provides an initial address and a write command to the memory controller. The memory controller provides a row address to the memory with a row address strobe. The memory controller then provides a write command, a column address and a column address strobe to the memory. The memory will equilibrate internal data I/O lines in response to receipt of the write command and column address. During the equilibrate operation, write data and write command signals are passed to global sense amplifiers within the burst access memory device. At the end of the equilibrate operation, write data drivers are enabled, and write data is stored in the memory array. In a preferred embodiment, positive (low to high) transitions of /CAS will cause an internal address counter of the memory device to advance to the next burst address. Negative (high to low) transitions of /CAS will then end the previous write cycle and equilibrate the I/O lines. The negative transition of /CAS will also allow the burst address from the counter to be applied to the array. Once the equilibration is complete, the next write will be performed at the burst address from the counter. In an alternate embodiment, a clock signal is input to a burst access device to control generation of a burst address from the counter (SDRAMs for example have a clock input pin).

In another embodiment, memory 124 operates in a page mode such as Fast Page Mode or EDO mode. Write commands at memory sense amps are enabled by the equilibrate signal becoming inactive at the sense amp. Using the equilibrate signal at the sense amp to gate the write signal to enable the write drivers eliminates wasted time associated with delaying the write driver enable signal to prevent excessive currents from flowing through the write drivers during the equilibration operation.

For the purposes of this specification a node may be, but is not limited to, an intersection of conductors, a circuit input or output, or any point along a signal path. For example, the write command may be said to enter the global sense amp at node 164 and device 250 of FIG. 5 is said to be connected to a power source at node 270. Also, the term signal may refer to but is not limited to information transferred along a conductor, or may refer to the conductor itself. For example, It may be said that the equilibrate signal 188 is coupled to the sense amp 66. In this context, the term signal represents a physical conductor for carrying the electrical information to equilibrate the data I/O lines, and is not limited to the electrical information itself which is not present when the device is not connected to a power source. The term "coupled" refers to but is not limited to a connection which may be made directly, after buffering, or through another element such as a resistor, capacitor, transistor, or logic device. Typically, a device will be responsive at some time to a signal or another device which is coupled to it.

While the present invention has been described with reference to preferred embodiments, numerous modifications and variations of the invention will be apparent to one of skill in the art without departing from the scope of the invention.

What is claimed is:

1. A memory device having a plurality of internal data line pairs, an equilibration control circuit and a write cycle control circuit, the memory device further comprising:

a plurality of data sense amplifiers each coupled to the equilibration control circuit, the write cycle control circuit and at least one of the data line pairs;

a plurality of write data drivers, each write data driver associated with at least one of said data sense amplifiers; and a plurality of write data driver enable circuits, each write driver enable circuit associated with one of said write data drivers to enable said write data drivers to drive data onto at least one of the data line pairs in response to deassertion of an equilibrate signal from the equilibration control circuit while a write cycle enable signal from the write cycle control circuit is asserted.

2. The memory device of claim 1, further comprising:

a burst access control circuit adapted to receive an initial address in response to an access cycle strobe signal and to generate a series of addresses, each in response to a further transition of the access cycle strobe signal.

3. The memory device of claim 2, further comprising:

an output buffer coupled to at least one of said data sense amplifiers and to the access cycle strobe signal, said output buffer adapted to drive data from the memory device in response to a plurality of transitions of the access cycle strobe signal.

4. The memory device of claim 3, wherein the access cycle strobe signal is a column address strobe signal and the memory device is a burst extended data out dynamic random access memory device.

5. The memory device of claim 1, wherein the memory device is adapted to operate in an Extended Data Out page mode.

6. A memory device comprising:

a plurality of write data drivers comprising an enable input, a data input and a data output;

a plurality of data lines, each of said data lines coupled to the data output of at least one of said write data drivers; and a plurality of write data driver enable circuits, each of said write data driver enable circuits adapted to receive a write cycle control signal and an equilibrate control signal, each of said write data driver enable circuits located in close proximity and coupled to the enable input of at least one of said write data drivers.

7. The memory device of claim 6, further comprising:

a plurality of data sense amplifiers, each of said data sense amplifiers being associated with one of the plurality of write data drivers.

8. The memory device of claim 7, further comprising:

a plurality of memory element subarrays, each of said subarrays coupled to at least one of said write data drivers by at least one of said data lines, and each of said subarrays coupled to at least one of said data sense amplifiers by at least one of said data lines.

9. The memory device of claim 8, further comprising:

a plurality of equilibration transistors, each of said equilibration transistors responsive to the equilibrate control signal to couple at least two of said data lines together.

10. The memory device of claim 9, wherein said write data drivers are disabled by said write data driver enable circuits while said equilibration transistors couple said data lines together.

11. A memory device comprising:

a memory element array region;

a plurality of data line pairs dispersed within said memory element array region; and a plurality of write data drivers dispersed along an edge of said memory element array region, each comprising an equilibrate input, a write active input, a write data input and a write data output, each of said write data drivers adapted to drive a data signal from the write data input to at least one of said data line pairs.

12. The memory device of claim 11, further comprising:

a main logic region outside said array region, said main logic region comprising an equilibration control circuit adapted to provide an equilibrate signal to the equilibrate input of said write data drivers.

13. The memory device of claim 12, further comprising:

a pads and logic region outside said array region and outside said main logic region, wherein the equilibrate signal is routed from said main logic region through said pads and logic region to said write data drivers.

14. The memory device of claim 11, further comprising:

a main logic region outside said array region, said main logic region comprising a write cycle control circuit adapted to provide a write active signal to the write active input of said write data drivers.

15. The memory device of claim 14, further comprising:

a pads and logic region outside said array region and outside said main logic region, wherein the write active signal is routed from said main logic region through said pads and logic region to said write data drivers.

16. A memory device comprising:

a memory element array region;

a control circuit region, outside of said memory element array region, for generating memory control signals including an equilibrate signal and a write enable signal;

a plurality of data line pairs dispersed throughout said memory element array region;

a plurality of data sense amplifiers, said data sense amplifiers distributed along an edge of said memory element array region, each amplifier proximately located to at least one of said data line pairs; and a distributed plurality of write data drivers each comprising an equilibrate inactive input enable responsive to the equilibrate signal and a write active input enable responsive to the write enable signal, each of said write data drivers proximately located to a data sense amplifier and associated with at least one of said data line pairs.

17. The memory device of claim 16, further comprising:

an address strobe input adapted to receive an address strobe signal; and an address counter responsive to the address strobe signal to generate an address and to provide the address to said memory element array region.

18. A memory device comprising:

a data input;

a plurality of memory element subarrays; and a plurality of data sense amplifiers coupled to said subarrays, each of said data sense amplifiers comprising a write data driver responsive to an active write enable signal and an inactive equilibration signal, to drive write data received on said data input to a corresponding one of said subarrays.

19. A method of storing data in a system comprising steps of:

providing a memory having a distributed plurality of data driver enable circuits;

addressing the memory;

providing data to the memory;

asserting an equilibration signal at the plurality of data driver enable circuits in response to said step of addressing;

asserting a write enable signal to the plurality of data driver enable circuits;

deasserting the equilibration signal;

gating a write enable signal through at least one of the data driver enable circuits in response to said step of deasserting; and storing data in a memory cell of the memory in response to said step of gating a write enable signal.

* * * * *